(12) United States Patent
Hu et al.

(10) Patent No.: US 7,480,317 B2
(45) Date of Patent: Jan. 20, 2009

(54) THERMAL COMPENSATION IN SEMICONDUCTOR LASERS

(75) Inventors: Martin Hai Hu, Painted Post, NY (US); Daniel Ohen Ricketts, Corning, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 51 days.

(21) Appl. No.: 11/526,988

(22) Filed: Sep. 26, 2006

(65) Prior Publication Data

US 2008/0075132 A1     Mar. 27, 2008

(51) Int. Cl.
H01S 3/10     (2006.01)
H01S 3/04     (2006.01)

(52) U.S. Cl. ............................ 372/21; 22/34
(58) Field of Classification Search .......... 372/21, 372/22, 29.02, 29.023, 31, 34, 36
See application file for complete search history.

(56) References Cited

U.S. PATENT DOCUMENTS

| | | | |
|---|---|---|---|
| 5,438,579 A | 8/1995 | Eda et al. | 372/34 |
| 5,603,570 A * | 2/1997 | Shimizu | 374/100 |
| 6,496,299 B2 | 12/2002 | Yamamoto et al. | 359/328 |
| 6,700,910 B1 | 3/2004 | Aoki et al. | 372/43 |
| 2003/0219046 A1* | 11/2003 | Kitaoka et al. | 372/32 |
| 2005/0185684 A1 | 8/2005 | Stewart et al. | 372/29.02 |
| 2005/0254531 A1 | 11/2005 | Furukawa et al. | 372/22 |

FOREIGN PATENT DOCUMENTS

| | | |
|---|---|---|
| EP | 0 774 684 | 5/1997 |
| JP | 61 265885 | 11/1986 |
| JP | 05 343787 | 12/1993 |
| JP | 2001 102674 | 4/2001 |

OTHER PUBLICATIONS

T Kameda et al, "A DBR laser employing passive-section heaters, with 10.8 nm tuning range and 1.6 MHz linewidth," IEEE Photonics Technology Letters, vol. 5, Issue 6, Jun. 1993 pp. 608-610.
Patent Abstract of Japanese Publication #05343787; Publication date: Dec. 24, 1993; Hidenari.
Patent Abstract of Japanese Publication #61265885; Publication date: Nov. 25, 1986; Yuzo.
Patent Abstract of Japanese Publication #2001102674; Publication date: Apr. 13, 2001; Tomoki.

* cited by examiner

Primary Examiner—Armando Rodriguez
(74) Attorney, Agent, or Firm—Kwadjo Adusei-Poku; Robert L. Carlson; Dunsmore-Shohl, LLP (57) ABSTRACT

The present invention relates to relates generally to semiconductor lasers and, more particularly, to schemes for measuring and controlling the temperature of semiconductor lasers and schemes for wavelength stabilization of semiconductor lasers. According to one embodiment of the present invention, a method of driving a temperature control mechanism in a semiconductor laser is provided. According to the method, signals representing an operating temperature of the semiconductor laser and ambient temperature are generated and a target laser operating temperature that is a function of the ambient temperature signal is established. A temperature control mechanism of the semiconductor laser is then driven to increase a degree of correlation between the operating temperature signal and the target laser operating temperature. Additional embodiments are disclosed and claimed.

19 Claims, 6 Drawing Sheets

THERMAL COMPENSATION IN SEMICONDUCTOR LASERS

BACKGROUND OF THE INVENTION

The present invention relates generally to semiconductor lasers and, more particularly, to schemes for measuring and controlling the temperature of semiconductor lasers and schemes for wavelength stabilization of semiconductor lasers.

SUMMARY OF THE INVENTION

The present invention relates generally to semiconductor lasers, which may be configured in a variety of ways. For example and by way of illustration, not limitation, short wavelength sources can be configured for high-speed modulation by combining a single-wavelength semiconductor laser, such as a distributed feedback (DFB) laser or a distributed Bragg reflector (DBR) laser, with a light wavelength conversion device, such as a second harmonic generation (SHG) crystal. The SHG crystal can be configured to generate higher harmonic waves of the fundamental laser signal by tuning, for example, a 1060 nm DBR or DFB laser to the spectral center of a SHG crystal, which converts the wavelength to 530 nm. However, the wavelength conversion efficiency of a SHG crystal, such as an MgO-doped periodically poled lithium niobate (PPLN), is strongly dependent on the wavelength matching between the laser diode and the SHG device. As will be appreciated by those familiar with laser design DFB lasers are resonant-cavity lasers using grids or similar structures etched into the semiconductor material as a reflective medium. DBR lasers are lasers in which the etched grating is physically separated from the electronic pumping area of the semiconductor laser. SHG crystals use second harmonic generation properties of non-linear crystals to frequency double laser radiation.

The allowable wavelength width of a PPLN SHG device is very small—for a typical PPLN SHG wavelength conversion device, the full width half maximum (FWHM) wavelength conversion bandwidth is only about 0.16 nm. In many cases, the output wavelength of a semiconductor laser will vary outside of this allowable bandwidth when the temperature of the laser changes by about 2.0° C. to 2.7° C. or more. Once the laser output deviates from the allowable bandwidth of the wavelength conversion device, the output power of the conversion device at the target wavelength drops drastically.

Given the challenges associated with wavelength matching and stabilization in developing laser sources, the present inventors have recognized the beneficial potential of schemes for measuring and controlling the temperature of semiconductor lasers and semiconductor lasers that can be actively tuned to achieve optimum output power. For example, the present inventors have recognized that short wavelength devices can be modulated at high speeds without excessive noise while maintaining a non-fluctuating second harmonic output power if the wavelength of the semiconductor is maintained at a stable value during operation. The present invention also relates to wavelength matching and stabilization in laser sources in general, without regard to whether second harmonic generation is utilized in the laser source.

According to one embodiment of the present invention, a method of driving a temperature control mechanism in a semiconductor laser is provided. According to the method, signals representing an operating temperature of the semiconductor laser and ambient temperature are generated and a target laser operating temperature that is a function of the ambient temperature signal is established. A temperature control mechanism of the semiconductor laser is then driven to increase a degree of correlation between the operating temperature signal and the target laser operating temperature. The output lasing wavelength of the laser changes to a more suitable value as the temperature control mechanism is driven and the degree of correlation increases.

For example, according to the above-described method of driving a temperature control mechanism in a semiconductor laser, a semiconductor laser of the present invention may take the form of a DBR-type laser diode and the temperature control mechanism of the semiconductor laser can be driven to increase the degree of correlation between the operating temperature signal and the target laser operating temperature during modulation of the driving electrode injection current applied to the gain region of the laser. In this manner, the driving scheme of the present invention can be employed to reduce Bragg wavelength drift that would otherwise characterize operation of the semiconductor laser.

According to another embodiment of the present invention, a method of driving a temperature control mechanism in a semiconductor laser is provided. The semiconductor laser comprises a DBR laser diode comprising a wavelength selective region, a phase matching region, and a gain region. The semiconductor laser further comprises a DBR section temperature control mechanism comprising a heating element structure extending over the wavelength selective region or a driving electrode structure configured to inject current into the wavelength selective region. The DBR section temperature control mechanism is driven such that a temperature of the wavelength selective region is affected to a greater extent than temperatures of the phase matching region and the gain region.

According to yet another embodiment of the present invention, a method of generating a signal representing an operating temperature of a DBR semiconductor laser diode is provided. The DBR semiconductor laser diode is provided with a heating element structure that comprises a pair of heating element strips extending along the longitudinal dimension of the laser, on opposite sides of the laser's ridge waveguide, over the wavelength selective region of the laser. According to the method, a reference current is applied to the heating element strips and an operating temperature signal is generated by measuring a voltage across the pair of heating element. Alternatively, the operating temperature signal can be generated by measuring an electrical resistance of the heating element strips when a reference current or voltage is applied thereto.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1A:
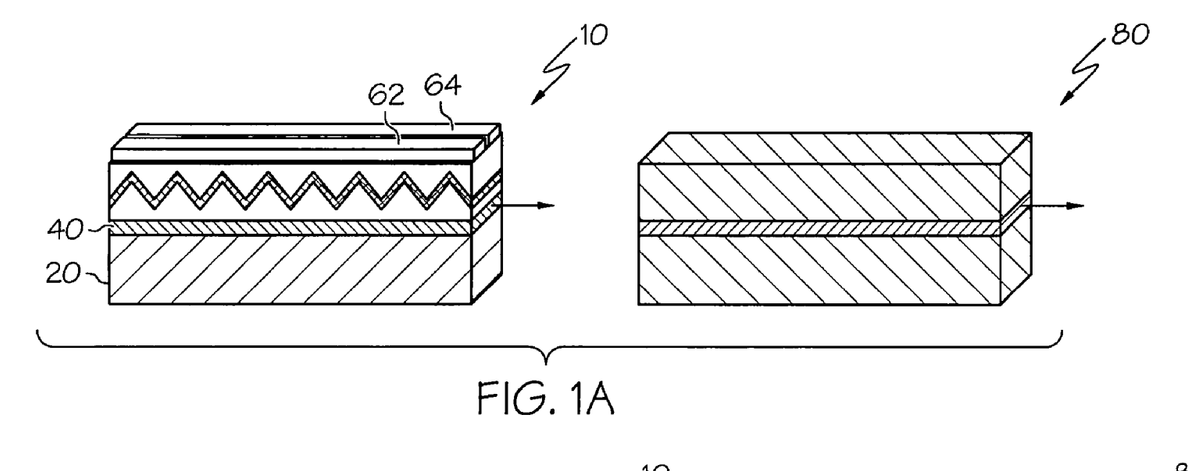
FIG. 1A is a schematic illustration of a DFB or similar type semiconductor laser optically coupled to a light wavelength conversion device and including micro-heating element structure according to the present invention.
Figure 1B:
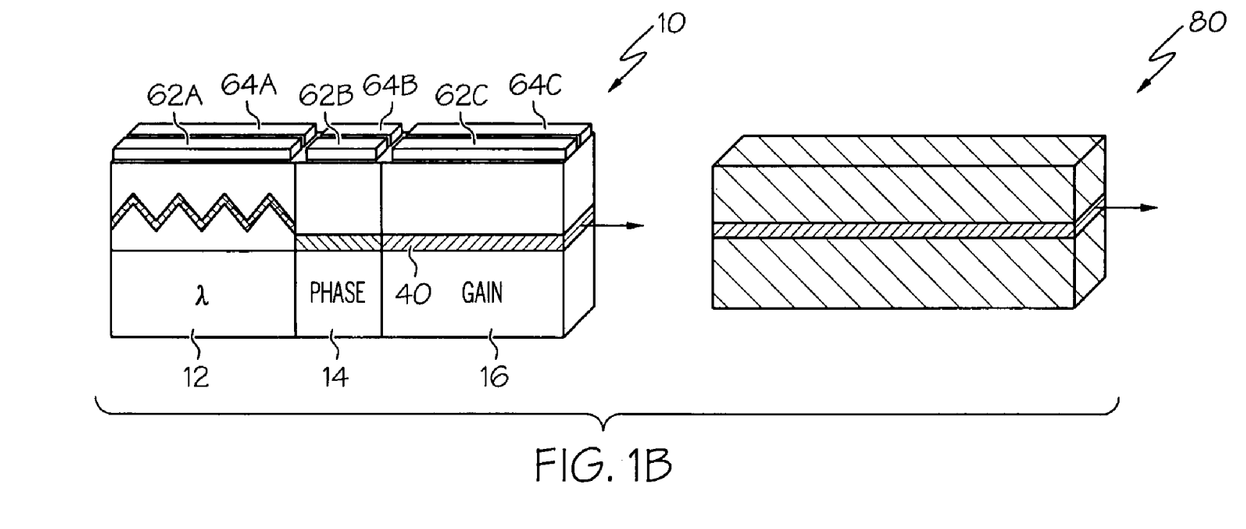
FIG. 1B is a schematic illustration of a DBR or similar type semiconductor laser optically coupled to a light wavelength conversion device and including micro-heating element structure according to the present invention.

FIGS. 1A and 1B, are respective schematic illustrations of DFB and DBR semiconductor lasers 10 optically coupled to light wavelength conversion devices 80. The light beam emitted by the semiconductor laser 10 can be either directly coupled into the waveguide of the wavelength conversion device 80 or can be coupled through collimating and focusing optics or some type of suitable optical element or optical system. The wavelength conversion device 80 converts the incident light into higher harmonic waves and outputs the converted signal.

Figure 4:
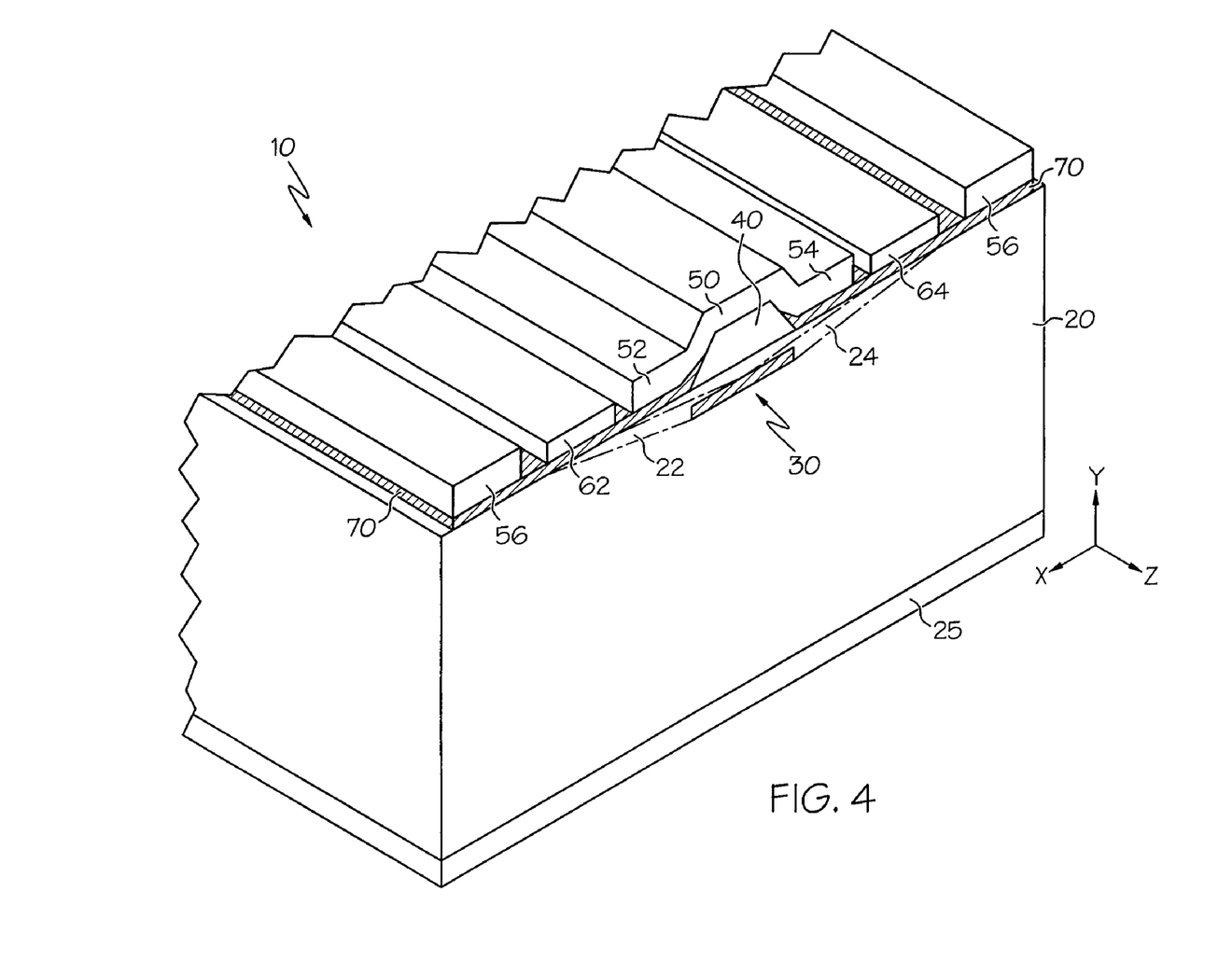
FIG. 4 is a cross-sectional schematic illustration of a semiconductor laser incorporating a micro-heating element structure according to one embodiment of the present invention.
Figure 5:
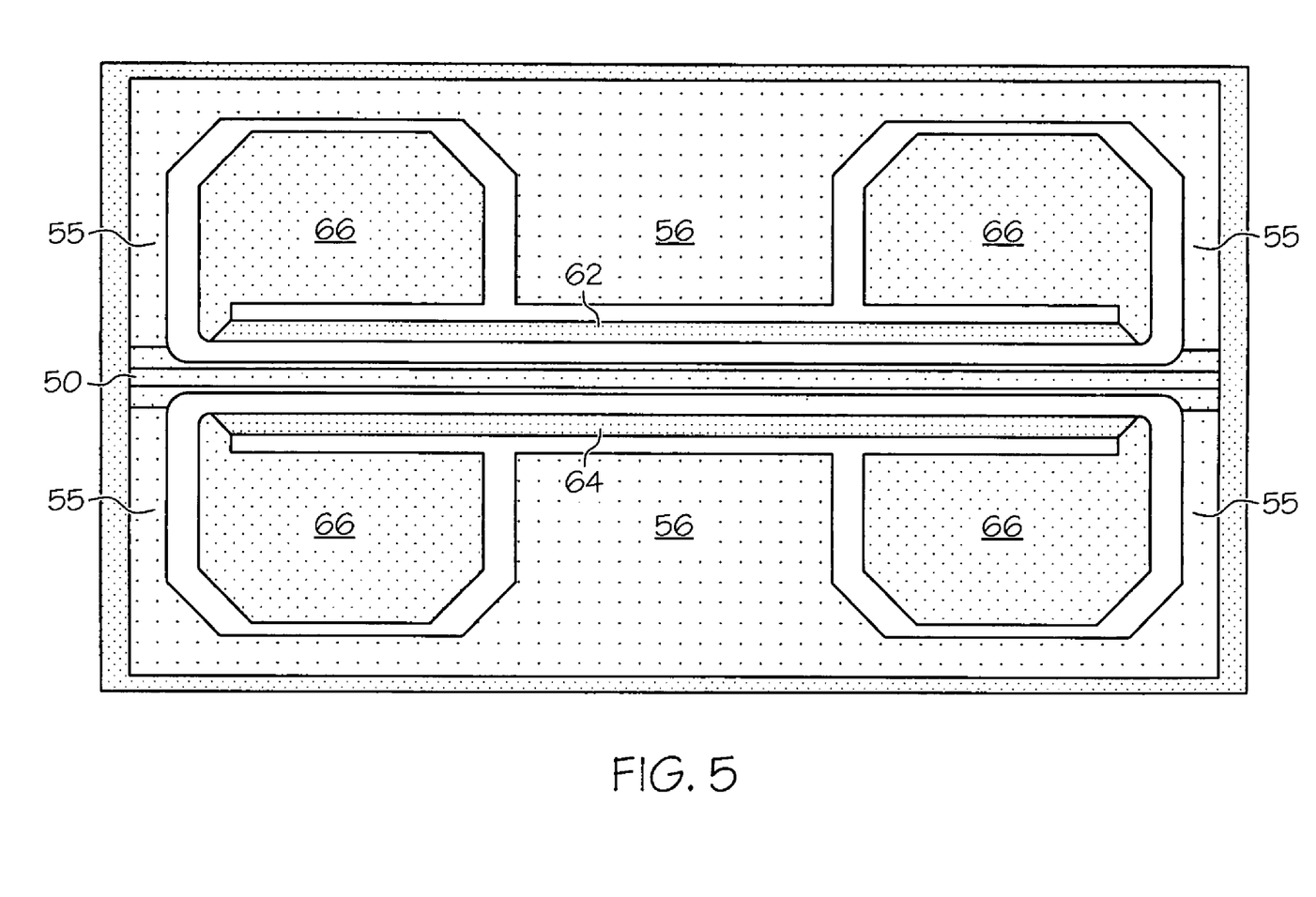
FIG. 5 is a plan view, schematic illustration of an electrode layer including a driving electrode structure and a micro-heating element structure according to the present invention.
Figure 6:
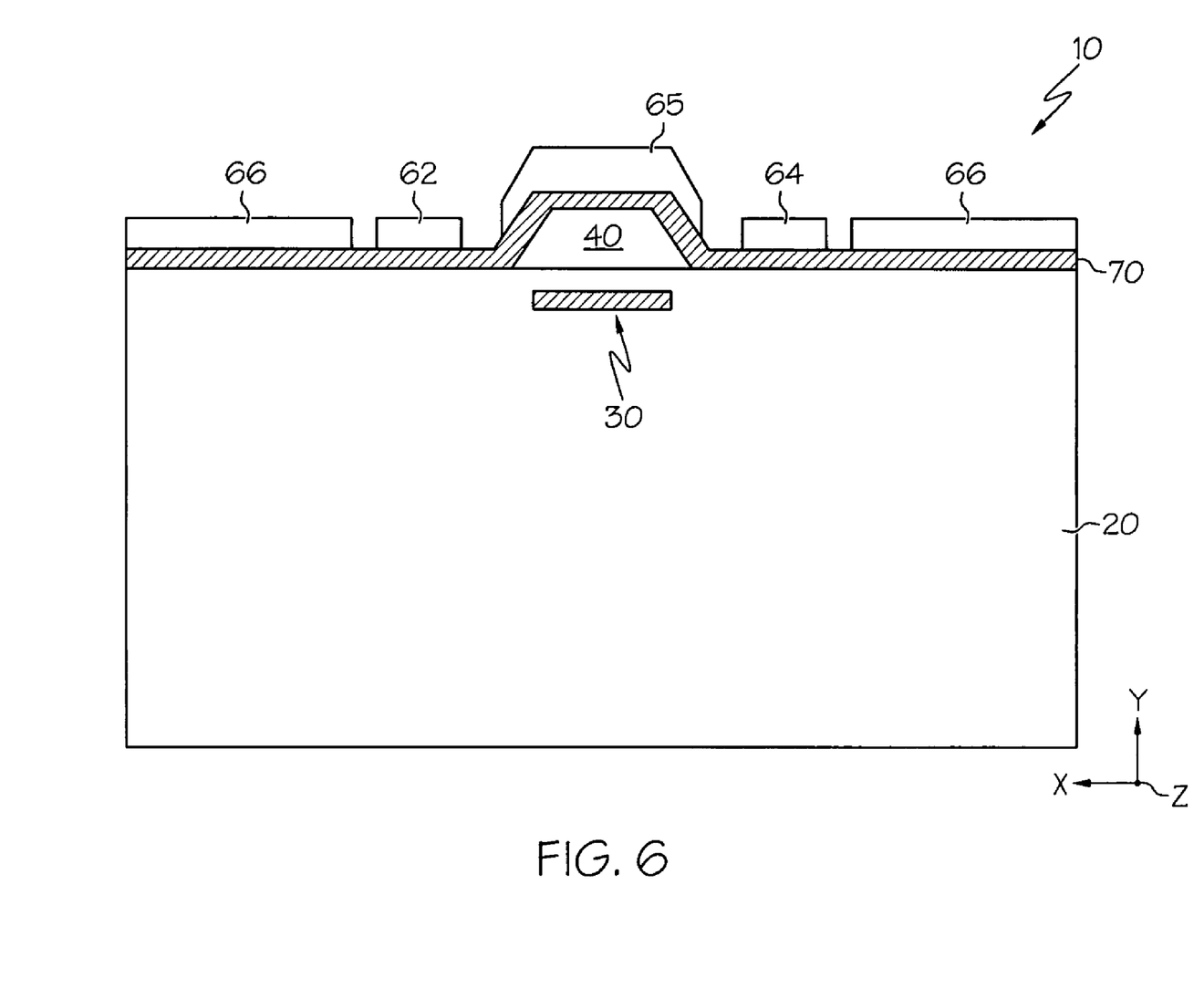
FIG. 6 is a schematic illustration of a semiconductor laser incorporating a micro-heating element structure according to another embodiment of the present invention.

As will be appreciated by those familiar with DFB laser design, the DFB semiconductor laser 10 illustrated schematically in FIG. 1A comprises a distributed feedback grating that extends generally along the direction of a ridge waveguide 40 incorporated within the laser 10. The ridge waveguide 40, which may comprise a raised or buried ridge structure, is positioned to optically guide the stimulated emission of photons along a longitudinal dimension Z of the semiconductor laser 10. Driving electrodes, not shown in FIG. 1A but discussed below with reference to FIGS. 4-6, are incorporated in the laser device to generate the electrical bias $V_{BIAS}$ necessary for operation of the laser 10. Heating element strips 62, 64, also described in further detail below, extend along at least a portion of the distributed feedback grating, on opposite sides of the ridge waveguide of the laser 10. For clarity of illustration, the relative size of the heating element strips 62 and 64 has been exaggerated and the ridge waveguide 40 has been illustrated schematically without regard to its actual position within the laser 10. FIGS. 4-5 and the accompanying text provide a better description of one preferred configuration of the waveguide 40, driving electrodes, and heating element strips 62, 64 for use in the context of the present invention.

As will be appreciated by those familiar with DBR laser design, the DBR laser 10 illustrated schematically in FIG. 1B comprises a wavelength selective region 12, a phase matching region 14, and a gain region 16. The wavelength selective region 12, which can also be referred to as the DBR section of the laser 10, typically comprises a first order or second order Bragg grating that is positioned outside the active region of the laser cavity. This section provides wavelength selection, as the grating acts as a mirror whose reflection coefficient depends on the wavelength. The gain region 16 of the DBR laser 10 provides the major optical gain of the laser and the phase matching region 14 creates an adjustable phase shift between the gain material of the gain region 16 and the reflective material of the wavelength selective region 12. The wavelength selective region 12 may be provided in a number of suitable alternative configurations that may or may not employ a Bragg grating. The ridge waveguide 40 extends through the wavelength selective region 12, the phase matching region 14, and the gain region 16. Heating element strips 62A, 64A, 62B, 64B, 62C, and 64C are incorporated in the wavelength selective region 12, the phase matching region 14, the gain region 16, or combinations thereof, and generally along the direction of a ridge waveguide 40.

The wavelength conversion efficiency of the wavelength conversion device 80 illustrated in FIGS. 1A and 1B is dependent on the wavelength matching between the semiconductor laser 10 and the wavelength conversion device 80. The output power of the higher harmonic light wave generated in the wavelength conversion device 80 drops drastically when the output wavelength of the laser 10 deviates from the wavelength conversion bandwidth of the wavelength conversion device 80. For example, in the case of a 12 mm-long PPLN SHG device, a temperature change in the semiconductor laser 10 of about 2° C. will typically be enough to take the output wavelength of the laser 10 outside of the 0.16 nm full width half maximum (FWHM) wavelength conversion bandwidth of the wavelength conversion device 80.

Figure 2A:
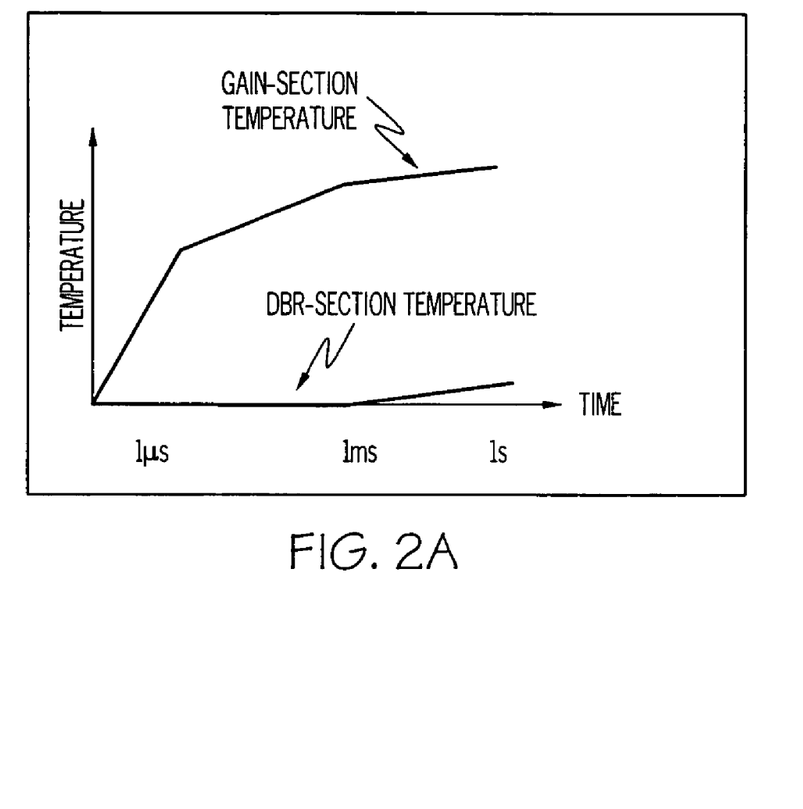
FIG. 2A illustrates temperature increase in a DBR semiconductor laser without the benefit of thermal compensation according to the present invention.
Figure 2B:
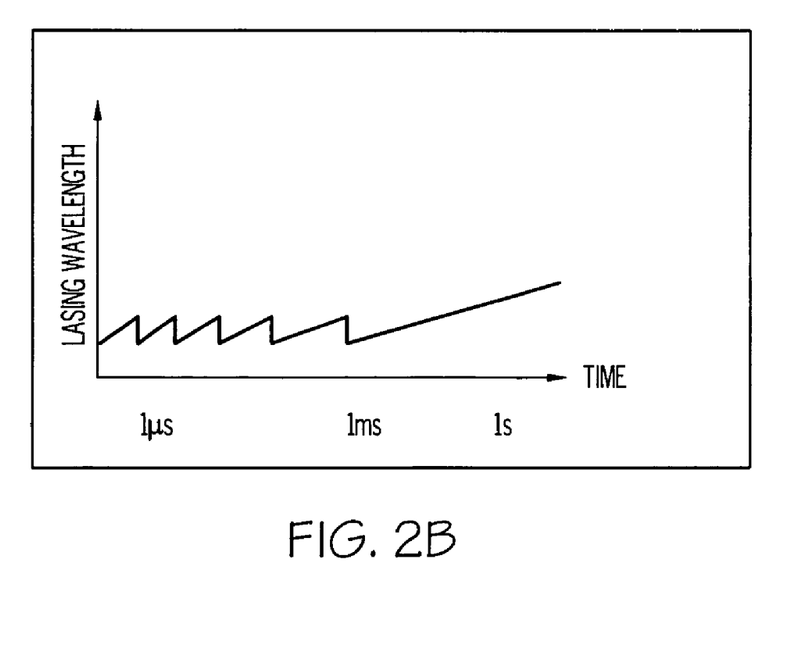
FIG. 2B illustrates changes in lasing wavelength over time as the gain section of a DBR semiconductor laser is driven in a conventional manner.

The present inventors have recognized that a variety of external and internal factors can change the temperature of a semiconductor laser and alter its output wavelength. For example, changes in ambient temperature, i.e., the temperature of the surroundings in which the laser is positioned, can lead to significant changes in the temperature of a semiconductor laser and its lasing wavelength. Further, referring to FIGS. 2A and 2B, as the gain section of a DBR semiconductor laser is driven in a conventional manner, the active region and cladding region of the gain section are initially heated and the refractive index of the gain section increases. This results in an increase in the optical path length and, as is illustrated in FIG. 2B, the lasing optical spectrum moves towards a longer wavelength over time and shifts down to a shorter wavelength abruptly. This mode-hopping phenomenon repeats in the manner illustrated in FIG. 2B until the heat generated from the driving current propagates through the gain-section thickness and reaches the bottom of the semiconductor laser. At this point, e.g., at about 1 ms in the embodiment illustrated in FIGS. 2A and 2B, the whole laser chip including the gain, phase and DBR sections begins to see a significant temperature rise and the lasing wavelength increases steadily with increasing temperature over time. This steady increase in temperature is illustrated graphically in FIG. 2B, starting at about 1 ms. This thermally-induced wavelength change leads to an undesirable patterning effect for a DBR laser—illustrated in FIG. 2B as a thermally induced Bragg laser wavelength drift.

Figure 3A:
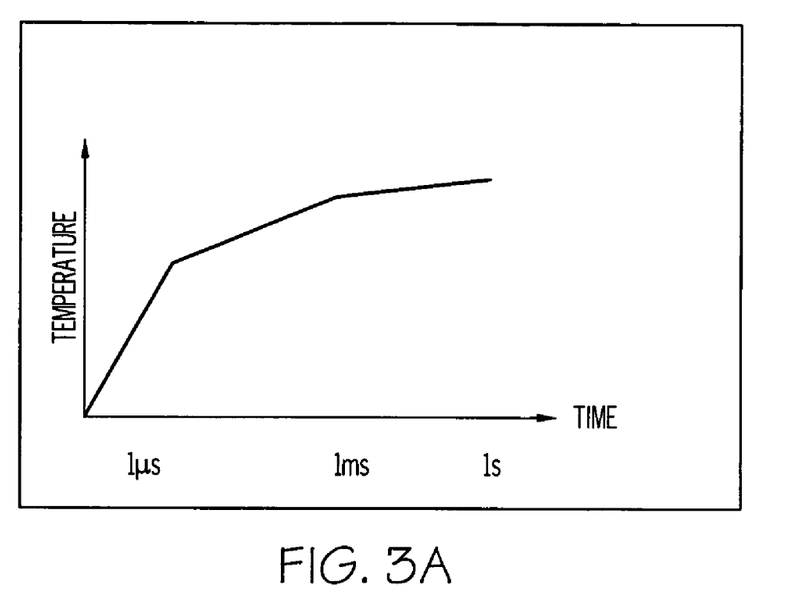
FIG. 3A illustrates temperature increase in a DFB semiconductor laser without the benefit of thermal compensation according to the present invention.
Figure 3B:
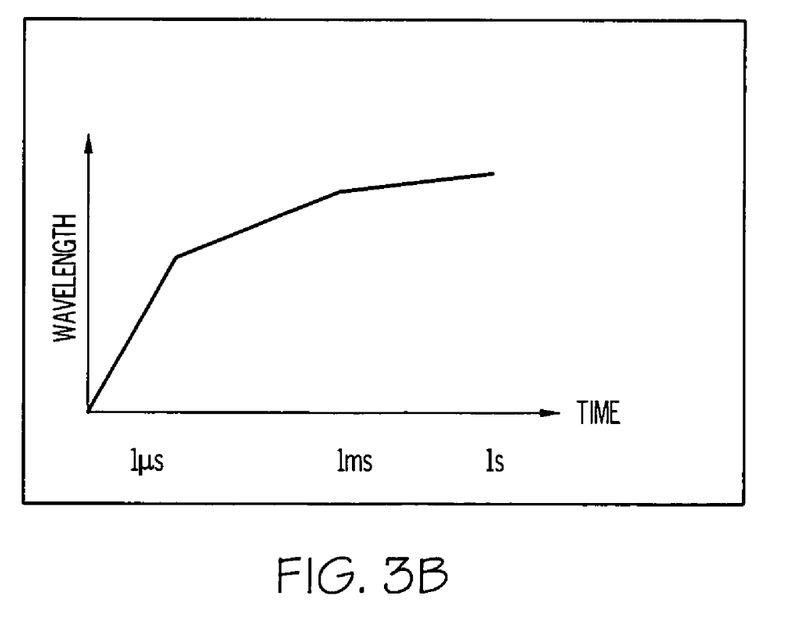
FIG. 3B illustrates the manner in which a thermally induced patterning effect causes laser wavelength drift over time in a conventionally-driven DFB semiconductor laser.

FIGS. 3A and 3B are presented to further illustrate thermal behavior in conventionally-driven semiconductor laser. Referring specifically to FIG. 3A, current injection into a DFB semiconductor laser increases the temperature of the active region and the cladding region of the laser over time. This increase in temperature leads to an increase in the refractive index of the DFB laser, resulting in an increase in both the optical path length and the Bragg grating wavelength of the laser. As a result, the lasing optical spectrum continuously moves toward longer wavelengths in the manner illustrated in FIG. 3B. As is noted above in the context of DBR semiconductor lasers, the thermally-induced wavelength change also leads to an undesirable patterning effect for DFB lasers.

The present invention relates to temperature measurement, thermal control, and wavelength stabilization in semiconductor lasers. Specific aspects of the present invention relate to schemes that enable precise wavelength matching between the semiconductor laser 10 and the associated wavelength conversion device 80, e.g., an SHG crystal. In this manner, the output light of the semiconductor laser 10 can be fully utilized and an efficient short wavelength laser source can be obtained. For example, according to one embodiment of the present invention, a method of driving a temperature control mechanism in a semiconductor laser is provided. The method is primarily applicable to lasers where the output lasing wavelength of the laser is a function of the operating temperature of the laser.

Initially, a signal representing the operating temperature of the semiconductor laser is generated. Although it is contemplated that the operating temperature signal may be generated in a variety of conventional or yet to be developed ways, according to one embodiment of the present invention, where the semiconductor laser comprises a heating element structure, the operating temperature signal is generated by measuring the electrical resistance of the heating element structure because the electrical resistance of a resistive heat element usually depends on the temperature. By way of illustration and not limitation, suitable heating element structures are described herein with reference to FIGS. 4-6. Additional conventional and yet to be developed heating element structures are also likely to be suitable in this regard. The operating temperature may also be generated by measuring a voltage across the driving electrode structure of the laser because the junction voltage of a semiconductor laser usually depends on the temperature. The driving electrode voltage may preferably be measured when a reference current is applied to the driving electrode structure.

A signal representing ambient temperature, i.e., the temperature of the surroundings in which the semiconductor laser 10 and the associated wavelength conversion device 80 are positioned, is also generated. It is contemplated that the ambient temperature signal may be generated in a variety of conventional or yet to be developed ways. For example, and not by way of limitation, where the output of the semiconductor laser is coupled to a wavelength conversion device, an ambient temperature signal can be generated indirectly by measuring the temperature of the wavelength conversion device. Alternatively, an ambient temperature signal can be generated by providing means for directly measuring the temperature of the surroundings in which the semiconductor laser 10 and the associated wavelength conversion device 80 are positioned.

The present inventors have recognized that semiconductor lasers are commonly coupled with wavelength conversion devices under conditions where both types of devices are subject to changes in ambient temperature. The lasing wavelength of many types of semiconductor lasers, e.g., DBR lasers, changes at different rate with temperature than the associated wavelength conversion device, e.g., a PPLN SHG crystal. Thus, a DBR laser having a lasing output that is properly matched to the conversion bandwidth of a wavelength conversion device at one ambient temperature, could become mismatched to the wavelength conversion device at another ambient temperature. As a result, changes in ambient temperature could result in reduced wavelength conversion efficiency, yielding significant drops in output amplitude.

To address this ambient temperature-induced mismatch, a target laser operating temperature is established that is a function of the ambient temperature signal and the temperature control mechanism of the semiconductor laser is driven to increase the degree of correlation between the operating temperature signal and the target laser operating temperature. Over time, the output lasing wavelength of the laser changes to a value that correlates more closely with the phase matching wavelength of the wavelength conversion device. Accordingly, one aspect of the present invention provides a means by which the wavelength of the laser output can be tuned to a phase-matching wavelength of the wavelength conversion device as the ambient temperature signal varies. For example, and not by way of limitation, the output lasing wavelength of a semiconductor laser can be tuned to vary such that it remains within a wavelength conversion bandwidth of a PPLN SHG wavelength conversion device, as the phase matching wavelength (also called the center wavelength) of the conversion device varies with ambient temperature. For the purposes of defining and describing the present invention, it is noted that variation of one parameter "with" an associated parameter should not be taken to require precise, lock step variation of the two parameters. In many cases according to the present invention, a parameter that varies with another parameter will actually trail the leading parameter to some degree.

The target laser operating temperature may be established by quantifying the temperature dependence of the optical device to which the laser is coupled. For example, in the case where the output of the semiconductor laser is optically coupled to a wavelength conversion device having a phase matching wavelength (also called the center wavelength) that is temperature dependent, the target laser operating temperature can be established to place the output lasing wavelength of the semiconductor laser within the wavelength conversion bandwidth of the wavelength conversion device as the ambient temperature varies.

Although it is contemplated that temperature control mechanisms according to the present invention may take a variety of conventional or yet to be developed forms, according to one embodiment of the present invention, the temperature control mechanism is embodied in the driving electrode structure of the laser. Generally, according to this aspect of the present invention, the operating laser temperature can be driven to track the target laser operating temperature by controlling the injection of current into the semiconductor junction of the laser via the driving electrode structure. Further detail regarding the use of driving electrode structure as the temperature control mechanism is presented below in the context of a DBR laser.

Temperature control mechanisms according to the present invention may also be embodied in an electrically resistive heating element structure thermally coupled to the semiconductor junction of the laser. Generally, according to this aspect of the present invention, the operating laser temperature can be driven to track the target laser operating temperature by controlling the degree to which the heating element structure heats the semiconductor junction of the laser. Further detail regarding the use of a heating element structure as the temperature control mechanism is also presented below in the context of a DBR laser.

Regardless of the particular temperature control mechanism utilized in accordance with the present invention, it is contemplated that the temperature control mechanism can be driven as a feedback loop wherein the operating temperature signal generating step and the temperature control driving step are repeated until the correlation between the operating temperature signal and the target laser operating temperature reaches a suitable value, e.g., until the lasing wavelength falls within the temperature dependent conversion band of the wavelength conversion device.

Where the semiconductor laser of the present invention takes the form of a DBR-type laser diode comprising a wavelength selective region, a phase matching region, and a gain region, the operating temperature signal of the semiconductor laser can be generated to most closely represent the temperature of the wavelength selective region. Similarly, the temperature control mechanism of the semiconductor laser can be driven to primarily affect the wavelength selective region. For example, the temperature control mechanism may comprise a heating element structure that extends primarily over the wavelength selective region or a driving electrode structure configured to inject current primarily into the wavelength selective region. For the purposes of describing and defining the present invention, it is noted that a mechanism or operation that "primarily" affects one region of the laser over another is to be taken to mean that the mechanism or operation affects the "one" region to a greater extent than the "other" region.

In instances where the semiconductor laser comprises a driving electrode structure configured to inject current into the wavelength selective region and one or both of the phase matching region and the gain region, the operating temperature signal may be generated by (i) applying reference currents to the wavelength selective, phase matching, and gain portions of the driving electrode structure and (ii) measuring the voltage across the wavelength selective portion of the driving electrode structure. In this manner, a more reliable indication of the operating temperature can be obtained. Similarly, where the semiconductor laser comprises a heating element structure extending over the wavelength selective region, the operating temperature signal may be generated by measuring a voltage across, or an electrical resistance of, the heating element structure when a reference current or reference voltage is applied to the heating element structure.

In the context of the DBR-type laser illustrated with reference to FIG. 1B and described in detail above, the present invention is directed to thermal monitoring and wavelength stabilization schemes where the wavelength selective region 12 of the semiconductor laser 10 is heated with a micro-heating element structure that extends over the wavelength selective region 12 or where the wavelength selective region 12 is heated by injecting electrical current $I_J$ into the wavelength selective region 12. As described above, changes in the ambient temperature and heat generated by the laser driving current $I_D$ can lead to changes in the output wavelength of the laser 10. To help account for this, the present invention introduces methods of driving a temperature control mechanism in a semiconductor laser.

For example, where a semiconductor laser comprises a DBR laser diode having an output lasing wavelength that is subject to variation under fluctuating operating temperatures, the semiconductor laser is configured to include a DBR section temperature control mechanism. The DBR section temperature control mechanism is configured to generate heat primarily in the wavelength selective region of the laser and comprises either (i) a heating element structure extending over the wavelength selective region or (ii) a driving electrode structure configured to inject current into the wavelength selective region. In this manner, the DBR section temperature control mechanism can be driven to primarily affect the temperature of the wavelength selective region.

In some embodiments of the present invention, the output of a semiconductor laser incorporating the temperature control mechanisms described herein can be configured such that its output is coupled to a wavelength-dependent optical device that defines its own output signal, such as a PPLN SHG wavelength conversion device. In such cases, the amplitude or wavelength of the output signal of the optical device can be monitored and the DBR section temperature control of the laser can be driven as a function of the monitored optical signal to optimize the wavelength or amplitude of the signal. For example, in the context of a wavelength conversion device coupled to a DBR laser, the DBR section temperature control can be driven to maximize the amplitude of the conversion device output signal.

Where the wavelength selective region 12 can be heated using a micro-heating element structure and by injecting electrical current $I_J$ into the wavelength selective region 12, the heating element driving current $I_H$ and the injection current $I_J$ can be controlled such that thermal control in the wavelength selective region 12 is initially achieved under the primary influence of the injection current $I_J$ and is subsequently achieved under the primary influence of the heating element driving current $I_H$. In this manner, the heating element driving current $I_H$ and the injection current $I_J$ can be used together to compensate for temperature fluctuations from the laser driving current $I_D$ in the gain region 16 or by changes in ambient temperature. The injection current $I_J$ is able to heat the wavelength selective region 12 more quickly than the heating element driving current $I_H$. Conversely, the heating element driving current $I_H$ and the micro-heating element structure are often less prone than the injection current $I_J$ to introduce undesirable effects in the laser, such as increase of optical loss and increase of line width. In addition, $I_H$ is often more efficient in term of laser temperature change per unit power of electrical input than $I_J$ under a continuous wave (CW) condition. Accordingly, the present invention contemplates combining the use of injection current and heating element driving current $I_H$ in the manner described above to compensate for temperature-related changes of optical path length.

As is noted above, the present invention also relates more broadly to temperature measurement schemes in the context of semiconductor lasers. According to this aspect of the present invention, a voltage across, or an electrical resistance of, the heating elements of one or more micro-heaters integrated in the semiconductor laser provides a measurement of laser temperature. In the context of a DBR semiconductor laser diode, as is illustrated in FIGS. 1B and 4, the heating element structure comprises a pair of heating element strips 62A, 64A extending along the longitudinal dimension of the semiconductor laser, on opposite sides of the ridge waveguide 40, over the wavelength selective region 12. The heating element strips are illustrated as reference numbers 62 and 64 in FIG. 4. In this manner, the heating element structure is configured to generate more heat in the wavelength selective region 12 than that which is generated in the phase matching region 14 and the gain region 16. To generate the operating temperature signal, a reference current or voltage is applied to the heating element strips and the voltage across, or the electrical resistance of, the pair of heating element strips 62A, 64A is measured when the reference current or voltage is applied to the heating element strips 62A, 64A.

Referring now to FIGS. 4-6, although the present invention is not limited to the use of particular micro-heating element structures, specific reference is made herein to suitable micro-heating element structures that may be used to measure and control the temperature of a semiconductor laser 10, or selected portions thereof, and enable schemes for wavelength stabilization of semiconductor lasers, in the manner described herein. The semiconductor laser 10 may comprise a semiconductor substrate 20 including an active region 30, a ridge waveguide 40, a driving electrode structure, and a micro-heating element structure. In the illustrated embodiment, the driving electrode structure comprises a driving electrode element 50 and the micro-heating element structure comprises a pair of heating element strips 62, 64. The active region 30 is defined by P and N type semiconductor material within the semiconductor substrate 20 and is configured for stimulated emission of photons under an electrical bias $V_{BIAS}$ generated by the driving electrode element 50 and a corresponding N-Type region 25 defined in the substrate 20. The wavelength output of the semiconductor laser 10 is dependent upon the temperature of the laser and the micro-heating element structure is configured to provide a means for heating and monitoring the temperature of the laser.

The heating element strips 62, 64 of the micro-heating element structure extend along the longitudinal dimension Z of the semiconductor laser 10 are fabricated from a material designed to generate heat with the flow of electrical current along a path extending generally parallel to the longitudinal dimension of the ridge waveguide, i.e., along the length of the strips 62, 64. For example, and not by way of limitation, it is contemplated that Pt, Ti, Cr, Au, W, Ag, and Al, taken individually or in various combinations, will be suitable for formation of the strips 62, 64. For example, it may be preferable to utilize an alloy comprising Au and Pt to form the heating element strips 62, 64.

For the purposes of defining and describing the present invention, it is noted that the specific structure of the various types of semiconductor lasers in which the concepts of the present invention can be incorporated is taught in readily available technical literature relating to the design and fabrication of semiconductor lasers. For example, and not by way of limitation, the semiconductor laser 10 may comprise a laser diode defining a distributed feedback (DFB) configuration or a distributed Bragg reflector (DBR) configuration.

As is illustrated in FIG. 4, the heating element strips 62, 64 are laterally positioned on opposite sides of the ridge waveguide 40 such that one of the heating element strips 62 extends along one side of the ridge waveguide 40 while the other heating element strip 64 extends along the other side of the ridge waveguide 40. Further, the driving electrode element 50 may also extend laterally on opposite sides of the ridge waveguide 40. The driving current to the heating element strips 62, 64 can be controlled to change the heat generated thereby and thus tune or lock the wavelength of the semiconductor laser.

As is further illustrated in FIG. 4, where lateral portions 52, 54 of the driving electrode element 50 extend laterally on opposite sides of the ridge waveguide 40, the driving electrode structure and the micro-heating element structure may preferably be arranged such that the lateral portion 52 of the driving electrode element 50 and the corresponding heating element strip 62 extend along the same side of the ridge waveguide 40, occupying respective portions of a common fabrication layer on the same side of the ridge waveguide 40. Similarly, the lateral portion 54 of the driving electrode element 50 and the corresponding heating element strip 64 extend along the other side of the ridge waveguide 40, occupying respective portions of a common fabrication layer on the other side of the ridge waveguide 40.

As used herein a "common fabrication layer" is a layer of a semiconductor device that comprises one ore more components positioned such that they may be fabricated in a common fabrication step. The identification of components herein as being in a common fabrication layer should not be interpreted to require that they be fabricated in a common plane. For example, referring to FIG. 4, the driving electrode element 50 and the heating element strips 62, 64 are not entirely coplanar but may be formed in a common fabrication step. Accordingly, they may be said to lie in a common fabrication layer. In contrast, the driving electrodes element 50 and the active region 30 cannot be said to lie in a common fabrication layer because the nature of the materials forming these components and the location of the components do not lend themselves to fabrication in a common step.

According to the design of the present invention, the location of the heating element strips 62, 64 can be optimized by allowing for the integration of the heating element strips 62, 64 with other electrode structure in a common fabrication layer, on a common side of the ridge waveguide 40. Although the present invention is illustrated in FIGS. 4 and 5 with driving electrode element 50 and corresponding heating element strips 62, 64 extending along both sides of the ridge waveguide 40, it is contemplated that driving electrode element 50 need not include the lateral portions 52, 54 or be provided on both sides of the ridge waveguide 40.

Also illustrated in FIG. 4 are respective direct heating paths 22, 24 that extend from the heating element strips 62, 64 of the micro-heating element structure, through the semiconductor substrate 20, to the active region 30. According to the illustrated embodiment of the present invention, the heating element strips 62, 64 are positioned such that the driving electrode structure does not interfere substantially with the direct heating paths 22, 24. "Substantial" interference with the direct heating paths can be quantified by referring to the amount of heat "sinked" by portions of the driving electrode structure interfering with the direct heating paths 22, 24. For example, it is contemplated that any interference that would reduce the amount of heat reaching the active region 30 by greater than about 10% to about 25% would be "substantial" interference with the direct heating path. In some contemplated preferred embodiments, the degree of interference corresponds to a reduction in directed heat of less than about 5%. In further contemplated embodiments, the heating element strips 62, 64 are positioned such that the driving electrode structure completely avoids interference with the direct heating paths 22, 24. In all of these embodiments, any heat sinking effect attributable to the driving electrode structure can be minimized, or at least reduced to a significant extent.

The micro-heating element structure should be positioned close enough to the active region 30 to ensure that heat generated by the heating element strips 62, 64 reaches the active region 30 area quickly, e.g., in about 4 microseconds or less. For example, and not by way of limitation, the heating element strips 62, 64 of the micro-heating element structure could be positioned such that they are displaced from the PN junction of the active region 30 by less than about 5 µm. It is contemplated that the spacing between the heating element strips 62, 64 and the active region 30 could be significantly less than 5 µm, e.g., about 2 µm, if the fabrication processes for forming the strips 62, 64 and the driving electrode structure are sufficiently precise.

Care should be taken to ensure that the operation of the driving electrode structure is not inhibited by the electrically conductive elements of the micro-heating element structure. For example, to this end, it may be preferable to ensure that the heating element strips 62, 64 of the micro-heating element structure are displaced from the driving electrode element 50 by at least about 2 µm. As is illustrated in FIG. 4, the resistive thin film forming the heating element strips 62, 64 and the various electrically conductive layers forming the driving electrode structure and the micro-heating element structure may be formed on an electrically insulating thin film 70 deposited directly on the semiconductor substrate 20. It is additionally noted that a thin protective coating may be formed over heating element strips 62, 64.

Referring to FIG. 5, the driving electrode structure may preferably comprise anode electrode regions 56 and the P-type metal of the driving electrode element 50 formed over and around the ridge waveguide 40 for current injection and heat distribution. The anode metal is connected to the P-type metal of the driving electrode element 50 through electrically conductive traces 55 formed around the heating element strips 62, 64 and the heating element contact pads 66. The heating element strips 62, 64 are located on both sides of the ridge 40, several micrometers to tens of micrometers away from the PN junction of the active region 30. There is a gap of several micrometers between the heating element strips 62, 64 and the P-type metal for electrical insulation. There is also a gap between the heating element strips 62, 64 and the anode electrode regions 56 and heating element contact pads 66. This gap width may be tailored so that the heat generated by the heating element strips 62, 64 would not be substantially dissipated through the anode electrode regions 56. As is noted above, it is contemplated that the aforementioned gap width may preferably be at least ten micrometers. It is contemplated that "substantial" dissipation of the heat generated by the heating element strips can be quantified by referring to the amount of heat "sinked" by portions of the anode electrode regions 56 and heating element contact pads 66. For example, it is contemplated that any dissipation by these elements that would reduce the amount of heat reaching the active region 30 by greater than about 10% to about 25% would be "substantial." In some contemplated preferred embodiments, the degree of dissipation corresponds to a reduction in directed heat of less than about 5%.

According to one embodiment of the present invention, the heating element strips 62A, 64A, 62B, 64B are configured to extend along the longitudinal dimension of the ridge waveguide 40 in the wavelength selective region 12 and the phase matching region 14 but do not extend a substantial distance in the gain region 16. This type of configuration has operational advantages in contexts where thermal control of the wavelength selective region 12 and the phase matching region 14 is desired.

Referring to FIG. 6, according to another embodiment of the present invention, the micro-heating element structure comprises a heating element strip 65 that extends along the longitudinal dimension Z of the semiconductor laser 10 over the ridge waveguide 40. In the context of a DBR-type laser, a heating element strip 65 of the type illustrated in FIG. 6 can be used to effectively heat either the wavelength selective region 12 or the phase matching region 14 of a DBR-type laser (see FIG. 1B) because these regions can be fabricated to exclude electrically conductive elements of the driving electrode structure. As is illustrated in FIG. 6, driving electrode elements 52, 54 may be provided alongside the ridge waveguide 40 where their inclusion is necessary or preferred.

As is illustrated in FIG. 6, the intervening space extending along the longitudinal dimension Z of the semiconductor laser 10 between the heating element strip 65 and the ridge waveguide 40 does not include any electrically conductive elements from the driving electrode structure. As a result, a direct heating path unencumbered by electrically conductive elements that could sink heat from the system can be established between the active region 30 and the heating element strip 65. It is contemplated that the width of the heating element strip 65 may preferably be at least as large as the width of the active region 30 but less than about four times the width of the active region 30.

Reference is made throughout the present application to various types of currents. For the purposes of describing and defining the present invention, it is noted that such currents refer to electrical currents. Further, for the purposes of defining and describing the present invention, it is noted that reference herein to "control" of an electrical current does not necessarily imply that the current is actively controlled or controlled as a function of any reference value. Rather, it is contemplated that an electrical current could be controlled by merely establishing the magnitude of the current.

It is to be understood that the following detailed description of the invention is intended to provide an overview or framework for understanding the nature and character of the invention as it is claimed. It will be apparent to those skilled in the art that various modifications and variations can be made to the present invention without departing from the spirit and scope of the invention. For example, it is contemplated that lasers operated according to the concepts of the present invention may be utilized in a scanning video projection system. In which case, the operating and ambient temperature signals used in the various control and measurement schemes of the present invention can be generated during a fly-back portion of an operating cycle of the projection system.

Thus, it is intended that the present invention cover the modifications and variations of this invention provided they come within the scope of the appended claims and their equivalents. For example, although the present description illustrates the concepts of the present invention in the context of a raised ridge waveguide, it is contemplated that the present invention will also have utility in the context of a "buried" ridge waveguide structure. Accordingly, the recitation of a "ridge waveguide" in the appended claims includes raised and buried ridge waveguides and should not be taken as limited to raised ridge waveguide structures.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

What is claimed is:

1. A method of driving a temperature control mechanism in a semiconductor laser wherein an output of said laser is coupled to a wavelength conversion device comprising a phase matching wavelength that varies with ambient temperature, said method comprising:

generating a signal representing an operating temperature of said laser;

generating a signal representing ambient temperature;

establishing a target laser operating temperature that is a function of said ambient temperature signal; and driving at least one temperature control mechanism of said semiconductor laser to vary an output lasing wavelength of said semiconductor laser such that it remains within a wavelength conversion bandwidth about said phase matching wavelength of said wavelength conversion device to increase a degree of correlation between said operating temperature signal and said target laser operating temperature such that said output lasing wavelength of said laser changes as said degree of correlation increases.

2. A method of driving a temperature control mechanism in a semiconductor laser wherein an output of said laser is coupled to a wavelength conversion device comprising a phase matching wavelength that varies with temperature, said method comprising:
generating a signal representing a temperature of said wavelength conversion device;
establishing a target laser operating temperature that is a function of said temperature signal; and
driving at least one temperature control mechanism of said semiconductor laser to vary an output lasing wavelength of said semiconductor laser such that it remains within a wavelength conversion bandwidth about said phase matching wavelength of said wavelength conversion device.

3. A method as claimed in claim 1 wherein said ambient temperature signal is generated by a direct measurement of said ambient temperature or by measuring a temperature of said wavelength conversion device.

4. A method of driving a temperature control mechanism in a semiconductor laser wherein an output of said laser is coupled to a wavelength conversion device comprising a phase matching wavelength that varies with temperature such that said wavelength conversion device defines its own optical output signal, said method comprising:
monitoring a wavelength or amplitude of the optical output signal of said wavelength conversion device; and
driving at least one temperature control mechanism of said semiconductor laser to vary an output lasing wavelength of said semiconductor laser such that it remains within a wavelength conversion bandwidth about said phase matching wavelength of said wavelength conversion device wherein said temperature control mechanism is driven to tune a wavelength of said laser output to a phase-matching wavelength of said wavelength conversion device as said optical output signal of said wavelength conversion device varies.

5. A method as claimed in claim 4 wherein said semiconductor laser comprises a heating element structure and said operating temperature signal is generated by measuring an electrical resistance of said heating element structure or measuring a voltage across said driving electrode structure.

6. A method as claimed in claim 2 wherein said target laser operating temperature is established by quantifying a temperature dependence of said wavelength conversion device.

7. A method as claimed in claim 6 wherein:
said wavelength conversion device comprises a phase matching wavelength that is temperature dependent; and
said target laser operating temperature is established to place said output lasing wavelength of said semiconductor laser within a wavelength conversion bandwidth about said phase matching wavelength of said wavelength conversion device.

8. A method of driving a temperature control mechanism in a semiconductor laser wherein an output of said laser is coupled to a wavelength conversion device comprising a phase matching wavelength that varies with temperature such that said wavelength conversion device defines its own optical output signal, said method comprising:
monitoring a wavelength or amplitude of the optical output signal of said wavelength conversion device; and
driving at least one temperature control mechanism of said semiconductor laser to vary an output lasing wavelength of said semiconductor laser such that it remains within a wavelength conversion bandwidth about said phase matching wavelength of said wavelength conversion device wherein said temperature control mechanism comprises a driving electrode structure and said temperature control mechanism is driven by controlling the injection of current into a semiconductor junction of said laser.

9. A method of driving a temperature control mechanism in a semiconductor laser wherein an output of said laser is coupled to a wavelength conversion device comprising a phase matching wavelength that varies with temperature such that said wavelength conversion device defines its own optical output signal, said method comprising:
monitoring a wavelength or amplitude of the optical output signal of said wavelength conversion device; and
driving at least one temperature control mechanism of said semiconductor laser to vary an output lasing wavelength of said semiconductor laser such that it remains within a wavelength conversion bandwidth about said phase matching wavelength of said wavelength conversion device wherein said temperature control mechanism comprises an electrically resistive heating element structure and said temperature control mechanism is driven by controlling the degree to which said heating element structure heats a semiconductor junction of said laser.

10. A method as claimed in claim 4 wherein said method of driving said temperature control mechanism is configured as a feedback loop.

11. A method as claimed in claim 4 wherein:
said semiconductor laser comprises a laser diode comprising a wavelength selective region and a gain region;
an operating temperature signal of said semiconductor laser is generated to represent a temperature of said wavelength selective region more closely than a temperature of said gain region;
said temperature control mechanism of said semiconductor laser is driven such that a temperature of said wavelength selective region is affected to a greater extent than a temperature of said gain region.

12. A method as claimed in claim 11 wherein said temperature control mechanism comprises a heating element structure extending over said wavelength selective region or a driving electrode structure configured to inject current into said wavelength selective region.

13. A method as claimed in claim 11 wherein:
said semiconductor laser comprises a driving electrode structure comprising respective portions configured to inject current into said wavelength selective region and said gain region;
said operating temperature signal is generated by measuring a voltage across said wavelength selective portion of said driving electrode structure when respective reference signals are applied to said wavelength selective and gain portions of said driving electrode structure.

14. A method as claimed in claim 11 wherein:
said semiconductor laser comprises a heating element structure extending over said wavelength selective region;
said operating temperature signal is generated by measuring a voltage across, or an electrical resistance of, said heating element structure when a reference current or voltage is applied to said heating element structure.

15. A method of driving a temperature control mechanism in a semiconductor laser wherein an output of said laser is coupled to a wavelength conversion device comprising a phase matching wavelength that varies with temperature such that said wavelength conversion device defines its own optical output signal, said method comprising:

monitoring a wavelength or amplitude of the optical output signal of said wavelength conversion device; and driving at least one temperature control mechanism of said semiconductor laser to vary an output lasing wavelength of said semiconductor laser such that it remains within a wavelength conversion bandwidth about said phase matching wavelength of said wavelength conversion device wherein:

said semiconductor laser comprises a laser diode comprising a wavelength selective region and a gain region; and said temperature control mechanism of said semiconductor laser is driven during modulation of a driving electrode injection current applied to said gain region to reduce wavelength drift that would otherwise characterize operation of said semiconductor laser.

16. A method of driving a temperature control mechanism in a semiconductor laser, wherein:

said semiconductor laser comprises a DBR laser diode comprising a wavelength selective region, a phase matching region, and a gain region and is configured such that an output lasing wavelength of said laser is a function of an operating temperature of said wavelength selective region;

said semiconductor laser further comprises a DBR section temperature control mechanism configured to generate more heat in said wavelength selective region than said phase matching region and generate more heat in said wavelength selective region than said gain region;

said DBR section temperature control mechanism comprises a heating element structure extending over said wavelength selective region or a driving electrode structure configured to inject current into said wavelength selective region; and said method comprises driving said DBR section temperature control mechanism such that a temperature of said wavelength selective region is affected to a greater extent than respective temperatures of said phase matching region and said gain region.

17. A method as claimed in claim 16 wherein said method further comprises:

monitoring a wavelength or amplitude of an optical signal from an optical device configured to receive said laser output; and driving said DBR section temperature control as a function of said monitored optical signal to optimize said wavelength or amplitude of said optical signal.

18. A method as claimed in claim 4, wherein:

said semiconductor laser comprises a laser diode comprising a wavelength selective region and a gain region;

said temperature control mechanism is configured to generate more heat in said wavelength selective region than said gain region; and said method comprises driving said temperature control mechanism such that a temperature of said wavelength selective region is affected to a greater extent than a temperature of said gain region.

19. A method as claimed in claim 4, wherein said temperature control mechanism comprises a heating element structure extending over said wavelength selective region or a driving electrode structure configured to inject current into said wavelength selective region.

\* \* \* \* \*